United States Patent [19]
Meyerand

[11] Patent Number: 5,469,060
[45] Date of Patent: Nov. 21, 1995

[54] TIME ENCODED MAGNETIC RESONANCE IMAGING

[76] Inventor: Mary E. Meyerand, 6676 Parkedge Cir., Franklin, Wis. 53132

[21] Appl. No.: 109,302

[22] Filed: Aug. 19, 1993

[51] Int. Cl.⁶ ..................................................... G01V 3/00
[52] U.S. Cl. ............................................. 324/309; 324/307
[58] Field of Search ....................................... 324/300, 307, 324/309, 306, 314

[56] References Cited

U.S. PATENT DOCUMENTS 5,122,748 6/1992 Oh et al. .................................. 324/307

Primary Examiner—Louis M. Arana
Attorney, Agent, or Firm—Fishman, Dionne & Cantor

[57] ABSTRACT

A method and apparatus for time encoded magnetic resonance imaging is presented. In accordance with the present invention, a static magnetic field oriented in a first direction is generated, with the sample to be imaged disposed within this static magnetic field, whereby the magnetization vector created by atomic particles is constant in size and direction as a result of the static magnetic field. The sample is then exposed to a first linear magnetic field gradient oriented in a second direction to define a slice. The sample is then excited with a radio frequency (RF) pulse, at the resonance frequency, the pulse being oriented in a third direction perpendicular to the first direction. This causes the magnetization vector of the atomic particles to rotate 90° into a plane perpendicular to the first direction. The sample is then exposed to a two dimensional, non-uniform, magnetic field gradient oriented in a plane perpendicular to the first direction. The sample is then exposed to a second uniform magnetic field gradient oriented in a fourth direction perpendicular to the second direction. A spin echo is produced by pulse or gradient reversal then the RF signals are detected. RF signals are emitted as a result of the spin echo, these RF signals vary in time as a result of the exposure to the two dimensional, non-uniform, gradient magnetic field. This time variance is indicative of spacial position within the slice. The RF signals received as a function of time are converted to a set of frequency domain functions at specific times relating to specific strips in the image by, for example, Short Time Fourier Transformer (STFT). These frequency domain functions in the form of strips, are combined sequentially to form the entire time-frequency domain function or the image.

36 Claims, 8 Drawing Sheets

TIME ENCODED MAGNETIC RESONANCE IMAGING

BACKGROUND OF THE INVENTION

This invention relates generally to the field of Magnetic Resonance Imaging (MRI) More particularly, to time encoded Magnetic Resonance Imaging.

Magnetic Resonance Imaging (MRI) is known. Two-dimensional MRI (for example, for a 256×256 pixel image) generally comprises disposing a sample to be imaged in a static magnetic field oriented in a first direction, whereby the magnetization vector created by the atomic particles of the sample possessing a nuclear magnetic moment is constant in size and direction. The sample is then exposed to a first linear magnetic field gradient oriented in a second direction to define a slice. The sample is then excited with a radio frequency (RF) pulse, at the resonance frequency, the pulse being oriented in a third direction perpendicular to the first direction to rotate the magnetization vector 90°. The sample is then exposed to a one-dimensional, uniform, gradient magnetic field oriented in a plane perpendicular to the first direction. A spin echo is produced by pulse or gradient reversal. At the same time the RF signals are detected, the sample is exposed to a second uniform magnetic field gradient oriented in a fourth direction perpendicular to the second direction. RF signals are emitted as a result of the spin echo, these RF signals are all received at the same time, however the atomic particles and the magnetization vector for each x-coordinate precesses with slightly different frequencies. Accordingly, each x-coordinate (in this example, 256 x-coordinates) has a different frequency. A Fourier transform is applied to this composite signal, whereby the signal for each x-coordinate is separated out from the composite signal.

The sample is again excited with a radio frequency (RF) pulse oriented in the third direction to rotate the magnetization vector 90°. The atomic particles again jump to a higher energy state. The sample is then exposed to a one-dimensional, uniform, gradient magnetic field oriented in a plane perpendicular to the first direction. A spin echo is produced by pulse or gradient reversal. Before the RF signals are detected, the sample is exposed to a second uniform magnetic field gradient oriented in the fourth direction. RF signals are emitted as a result of the spin echo, these RF signals are all received at the same time, however the atomic particles and the magnetization vector for each y-coordinate precesses with slightly different phase shift. Accordingly, each y-coordinate (in this example, 256 y-coordinates) has a different phase shift. However, unlike the x-coordinates these phase shifts cannot be separated to identify each y-coordinate. These signals are defined by repeated exposure, as described above (in this example 256, one for each y-coordinate). In order to distinguish these phase shifts, the size or time duration of the exposure to the magnetic field in the y plane for each successive pulse sequence is varied. The above MRI process is more fully described in *A Non-Mathematical Approach to Basic MRI*, by H. Smith and F. Ranallo, Medical Physics Publishing Corp., 1989, the entirety of which is incorporated herein by reference This process is very time consuming i.e., requiring 256 iterations to define the y-coordinates in a 256×256 image. This problem becomes clearly evident in the most common use of Magnetic Resonance Imaging (MRI), which is in the health care field. MRI has found wide-spread acceptance as a medical diagnostic technique for providing images of internal soft tissue structures of the human body. As is evident, in order to obtain these images a patient must be located within the MRI device for a considerable amount of time. Because of the requirement of a large static magnetic field, the patient is confined within a small space leading to a feeling of increased anxiety in some patients which is exacerbated by the lengthy duration of the imaging process. Additionally, this lengthy duration results in a high cost to the health care system because of, for example, operator time and the limited number of patients that can be examined in a given time. Thus making the MRI device less productive. In this day of health care reform due to sky rocketing health care costs, the impetus for this invention is most clearly evident.

SUMMARY OF THE INVENTION

The above-discussed and other drawbacks and deficiencies of the prior art are overcome or alleviated by the method and apparatus for time encoded magnetic imaging of the present invention. In accordance with the present invention, a static (i.e., constant in time) magnetic field oriented in a first direction is generated, with the sample to be imaged disposed within this static magnetic field, whereby the magnetization vector created by the atomic particles is constant in size and direction (e.g., preferably parallel to the direction of the static magnetic field) as a result the static magnetic field. The sample is then exposed to a first linear magnetic field gradient oriented in a second direction to define a slice. The sample is then excited with a radio frequency (RF) pulse (i.e., an electromagnetic radiation pulse), at the resonance frequency, the pulse being oriented in a third direction perpendicular to the first direction. This causes the magnetization vector of the atomic particles to rotate 90° into a plane perpendicular to the first direction. The sample is then exposed to a two dimensional, non-uniform, magnetic field gradient oriented in a plane perpendicular to the first direction. The sample is then exposed to a second uniform magnetic field gradient oriented in a fourth direction perpendicular to the second direction. A spin echo is produced by pulse or gradient reversal, as described hereinafter. Then the RF signals are detected. RF signals are emitted when the atomic particles return to their original energy levels, these RF signals vary in time as a result of the exposure to the two dimensional, non-uniform, gradient magnetic field. This time variance is indicative of spacial position within the slice. The RF signals received as a function of time are converted to a set of frequency domain functions at specific times relating to specific strips of an image by, for example, Short Time Fourier Transformer (STFT). These frequency functions in the form of strips, are combined sequentially to form an entire time-frequency domain function or an image.

In contrast to the prior art reiterative process of performing separate iterations for each two dimensional coordinate, the present invention obtains all of the coordinates in the sample in one iteration. Accordingly, the present invention significantly reduces the time and cost associated with Magnetic Resonance Imaging.

The above-discussed and other features and advantages of the present invention will be appreciated and understood by those skilled in the art from the following detailed description and drawings.

BRIEF DESCRIPTION OF THE DRAWINGS

Referring now to the drawings, wherein like elements are numbered alike in the several FIGURES:

FIG. 10A is a chart of FID time encoding in accordance with the present invention;

FIG. 10B is a chart of echo time encoding in accordance with the present invention;

DESCRIPTION OF THE PREFERRED EMBODIMENT

Figure 1:
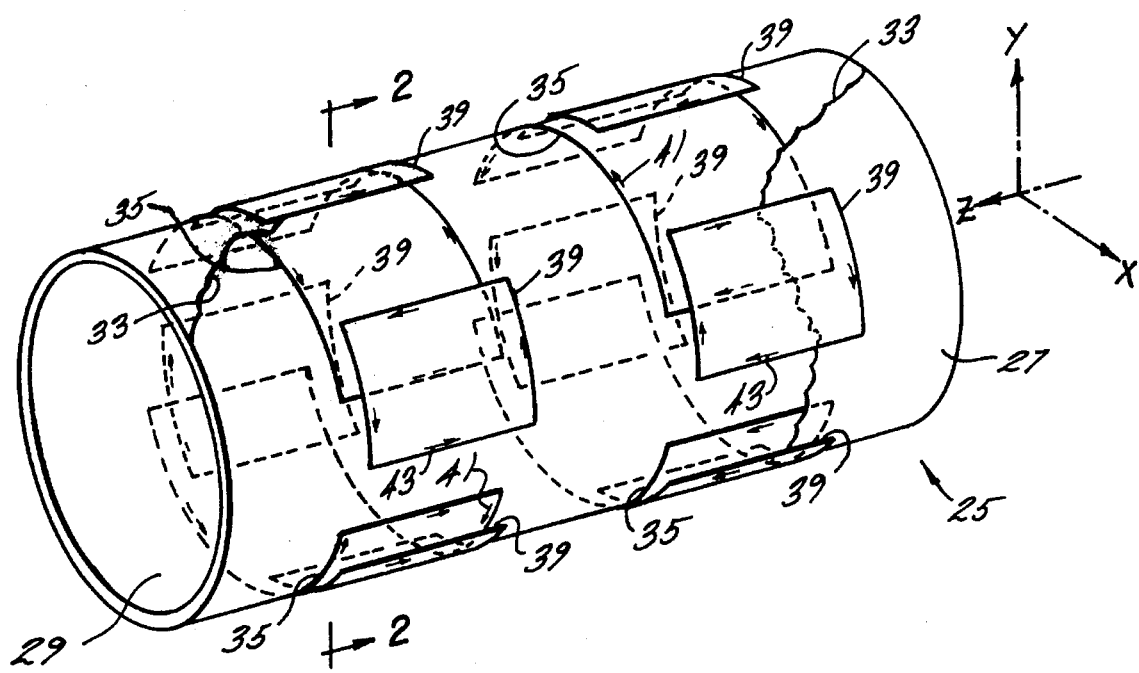
FIG. 1 is a diagrammatic perspective view the apparatus for magnetic resonance imaging in accordance with the present invention.
Figure 2:
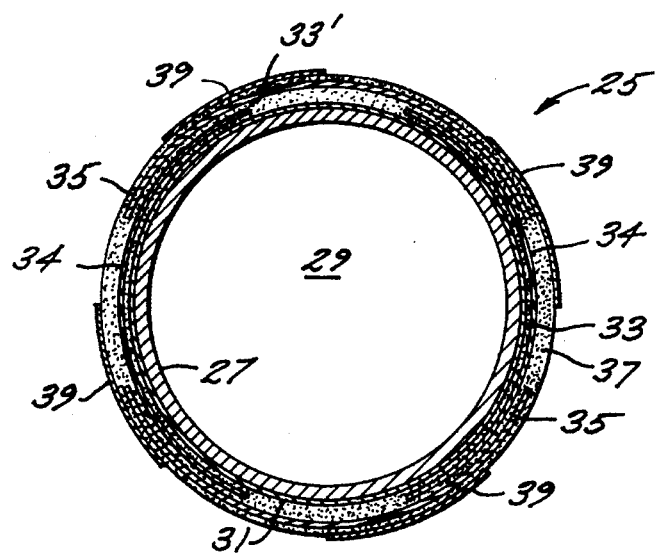
FIG. 2 is a diagrammatic cross sectional view taken along the line 2—2 in FIG. 1.

While the following example is described in connection with proton spin resonance, it will be appreciated that electron spin resonance, neutron spin resonance or electron paramagnetic resonance may be employed without departing from the spirit or scope of the present invention. Referring to FIGS. 1 and 2, a device for use with a MRI system in accordance with the present invention is shown generally at 25. Device 25 comprises a cylindrical magnetic core 27 having a central longitudinal opening 29. Typically and as preferred herein, the magnetic core is disposed in a housing (not shown). An object (also, referred to herein as a sample) to be imaged, although not shown, is disposed within opening 29 at about the longitudinal center thereof. The object may comprise a section of a human body (e. g., the head) for which an image is desired. Core 27 includes a multi-turn coil 31 disposed thereabout to form an electromagnet, as is well known in the art. An electrical current is applied to coil 31 in a direction so as to generate a static magnetic field in the direction of the z axis. An insulating layer 33 is disposed over coil 31. A plurality, in this example four, linear gradient coils 34 are concentrically disposed about coil 31 to generate a first uniform magnetic field in the direction of the z axis, in this example (the slice can be taken in any direction). An insulating layer 33' is disposed over coils 34. A plurality, in this example four, linear gradient coils 35 are concentrically disposed about coils 34 to generate a second uniform magnetic field gradient in the direction of the x axis. Coils 34 and 35 may be, for example, Golay type coils or finger print type coils. An insulating layer 37 is disposed over coils 35. A plurality, in this example eight, gradient coils 39 are concentrically disposed about coil 35 to generate together with coils 35, a two dimensional, non-uniform gradient magnetic field oriented in the x-y plane.

Arrows 41 and 43 indicate the direction of current flow in coils 35 and 39, respectively, from which the direction of the magnetic field generated therefrom can be determined using the well known 'right hand rule'.

Figure 3:
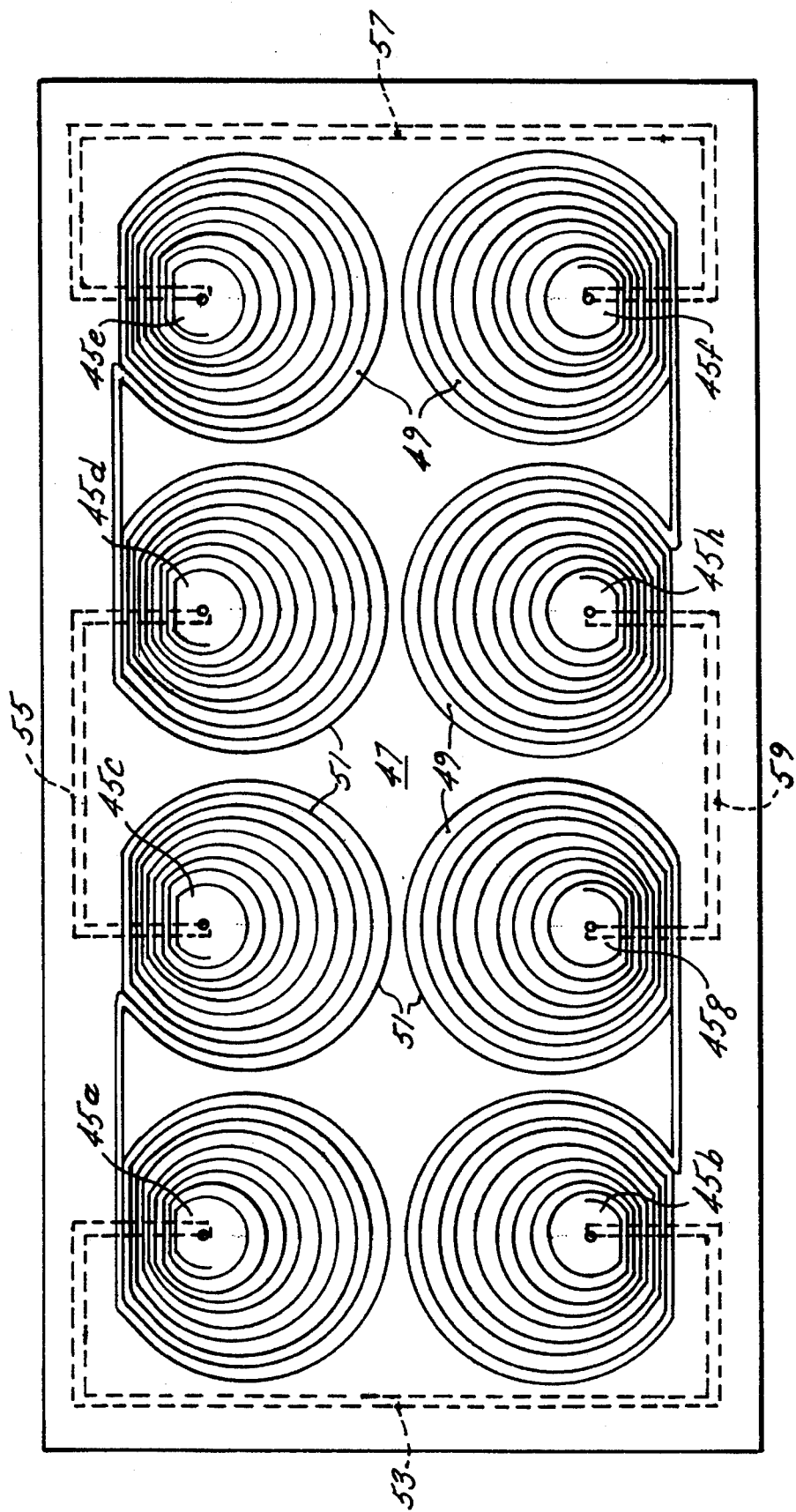
FIG. 3 is a diagrammatic plan view of the gradient coils in FIG. 1 for generating a two dimensional, non-uniform gradient magnetic field in accordance with the present invention.

Referring to FIG. 3, coils 39, for example, collectively comprise an array of coils 45a–h (e.g., octapole gradient coil arrangement) formed on a copper film 47 by, for example chemical or mechanical etch. Copper film 47 being deposited on a flexible non-conducting substrate (not shown). Leads 49 forming coils 45 are defined by etched lines 51. Coils 45a and 45b are interconnected by a lead line 53 deposited on the opposite side of the substrate. Coils 45c and 45d are interconnected by a lead line 55 deposited on the opposite side of the substrate. Coils 45e and 45f are interconnected by a lead line 57 deposited on the opposite side of the substrate. Coils 45g and 45h are interconnected by a lead line 59 deposited on the opposite side of the substrate. Coils 39 may alternatively be configured from standard wire coils as is well known.

A transmitting RF coil (not shown) is positioned relative to the device 25 to generate a RF pulse in the y axis direction, perpendicular to the direction of the static magnetic field generated by coils 33 and core 27 (i.e., the electromagnet), at the resonance or Larmour frequency. The resonance frequency is the frequency at which the protons (in this example) absorb energy from this radiation and jump to a higher energy state. A receiving RF coil (not shown) is positioned relative to the device 25 to receive an RF signal emitted when these protons return to their original energy state, as described hereinafter. The RF coils may be, for example, of the birdcage or Helmholtz type. It will be appreciated that the transmitting RF coil may also be used as the receiving RF coil.

While the coils have been described as disposed on the core, the coils may be disposed within the core or space away from the core, as is well known, provided the desired fields are generated.

It will be appreciated that while only one view is described herein, three different views of the object that is being imaged may be obtained. These views are referred to as transverse (or axial), coronal and sagittal slices or views. In the x, y, z coordinate system, a transverse slice is made along the x-y plane, a coronal slice along the x-z plane and a sagittal slice is made along the y-z plane. These different slices are obtained by using magnetic field slice select gradients along different directions. In other words, in traditional imaging, a transverse slice is made by applying a slice select gradient in the z direction, phase encoding in the y direction and then reading out or frequency encoding in the x direction. While a coronal slice is created by slice selecting in the y direction, phase encoding in the x direction and then frequency encoding in the z direction.

Figure 4:
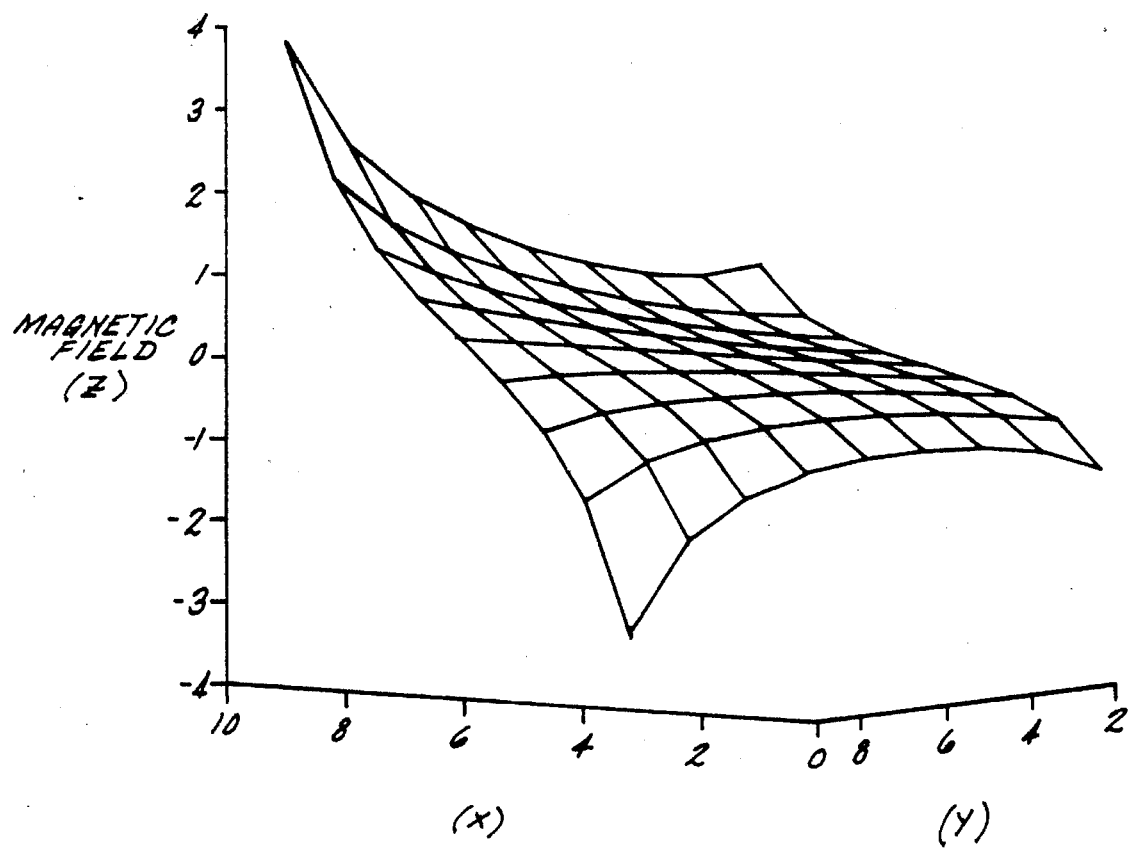
FIG. 4 is a diagrammatic isometric view of the two dimensional, non-uniform magnetic field gradient generated by the gradient coils of FIG. 3.

In accordance with the present invention, and by way of example only, a static (i.e., constant in time) magnetic field oriented in a first direction (z) is generated by the electromagnet, with the sample to be imaged disposed within this static magnetic field (i.e., within opening 29), whereby the magnetization vector created by the atomic particles (in this example the protons) is constant in size and direction (e.g., preferably parallel to the direction of the static magnetic field) as a result of the static magnetic field. The sample is then exposed to a first uniform magnetic field gradient oriented in a second direction (z), generated by coils 34. The sample is then excited with a radio frequency (RF) pulse (i.e., an electromagnetic radiation pulse) from the RF transmitting coil, at the resonance frequency, the pulse being oriented in a third direction (y), perpendicular to the first direction (z). This causes the magnetization vector of the atomic particles to rotate 90° into the x-y plane. The sample is then exposed to a two dimensional, non-uniform, magnetic field gradient (FIG. 4) oriented in the x-y plane, generated by coils 39. The sample is then exposed to a second uniform magnetic field gradient oriented in a fourth direction (x), generated by coils 35. A spin echo is produced by pulse or gradient reversal, as described hereinafter. Then the RF signals are detected by the RF receiving coil. RF signals are emitted when the atomic particles return to their original energy levels, these RF signals vary in time as a result of the exposure to the two dimensional, non-uniform, gradient magnetic field. This time variance is indicative of spacial position within, in this example, the x-y plane. It will be appreciated that three dimensional imaging may also be accomplished, for example whereby a three dimensional, non-uniform, gradient magnetic field would be employed instead of the two dimensional field described above or known multi-site techniques can be used. The RF signals received as a function of time are converted to a set of frequency domain functions at specific times relating to specific strips of an image by, for example, Short Time Fourier Transformer (STFT). These frequency functions, in the form of strips, are combined sequentially to form an entire time-frequency domain function or an image.

Figure 5:
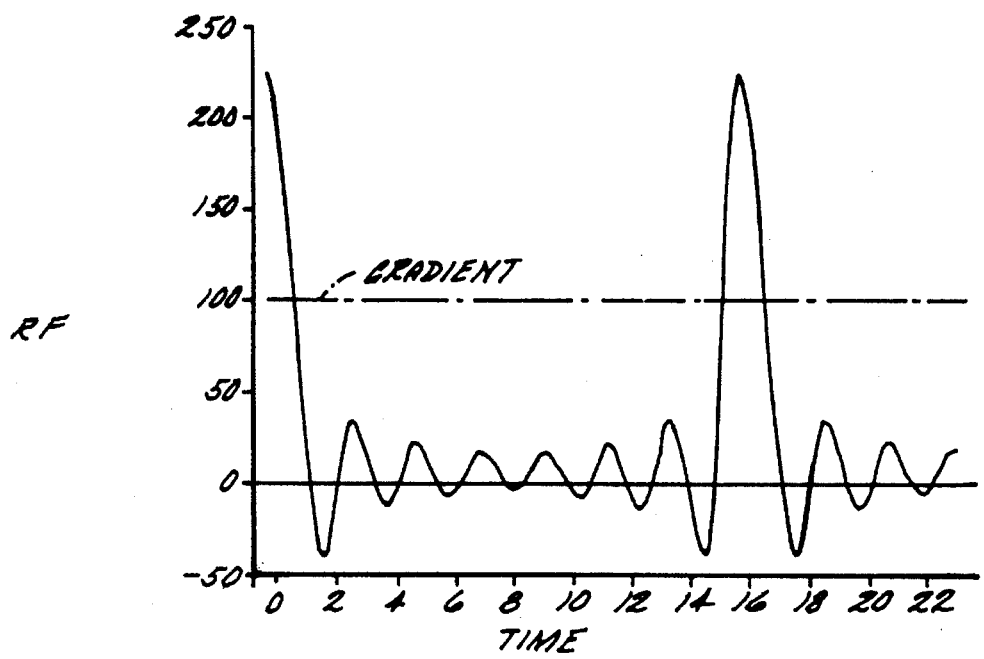
FIG. 5 is a plot of RF signal strength as a function of time in accordance with one embodiment of the present invention.

Referring to FIG. 5, spins initially placed in the x-y plane by the slice selection RF pulse as described above will begin to dephase producing a signal drop off. The rate of dephasing is governed by the magnetic field gradient strength. After most of the signal has decayed it can be recovered by either a 180° RF pulse or a reversal of the direction of the first magnetic field gradient. The 180° (or second) RF pulse is twice as long (in time) as the first RF pulse, which causes the magnetization vector to rotate 180° (as opposed to the 90° rotation indusced by the first RF pulse). This pulse or gradient reversal occurs at time T (at 8) and after an additional time T (at 16) the original signal is restored forming the spin echo. If the gradient is held constant in time (as indicated by the broken line) the echo will occur at a time equal to 2T (at 16). It will be appreciated that either the 180° RF pulse or a gradient reversal may be used to produce a spin echo.

Figure 6:
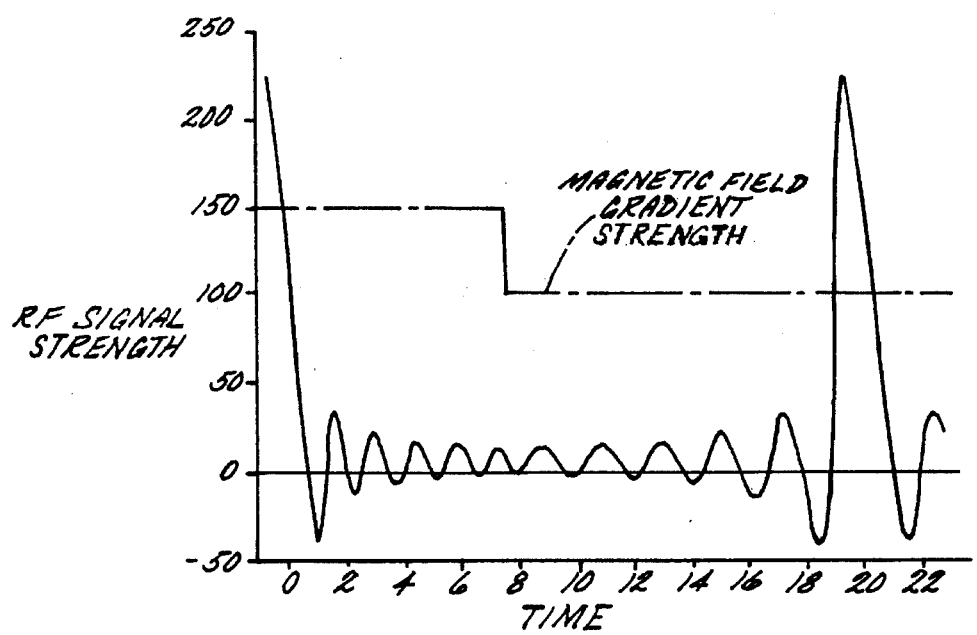
FIG. 6 is a plot of RF signal strength as a function of time in accordance with a first embodiment of the present invention.

Referring to FIG. 6, the gradient field strength is reduced after the echo pulse and the echo occurs at a time (at 20) later than when the gradient strength was kept constant during the pulse sequence (FIG. 5).

Figure 7:
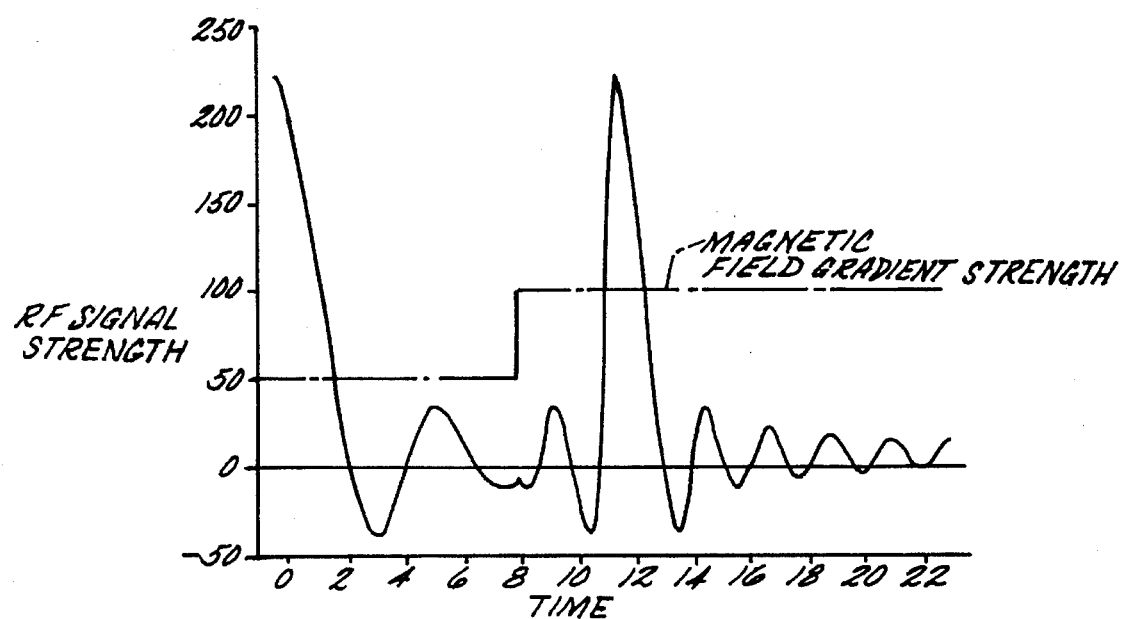
FIG. 7 is a plot of RF signal strength as a function of time in accordance with a second embodiment of the present invention.

Referring to FIG. 7, the gradient field strength is increased after the echo pulse and the echo at a time (at 12) earlier than when the gradient strength was kept constant during the pulse sequence (FIG. 5). Accordingly, the change in the gradient field strength can occur before or after the echo pulse. However, there is an inversion in the relationship between gradient strength and echo occurrence in time.

Figure 8:
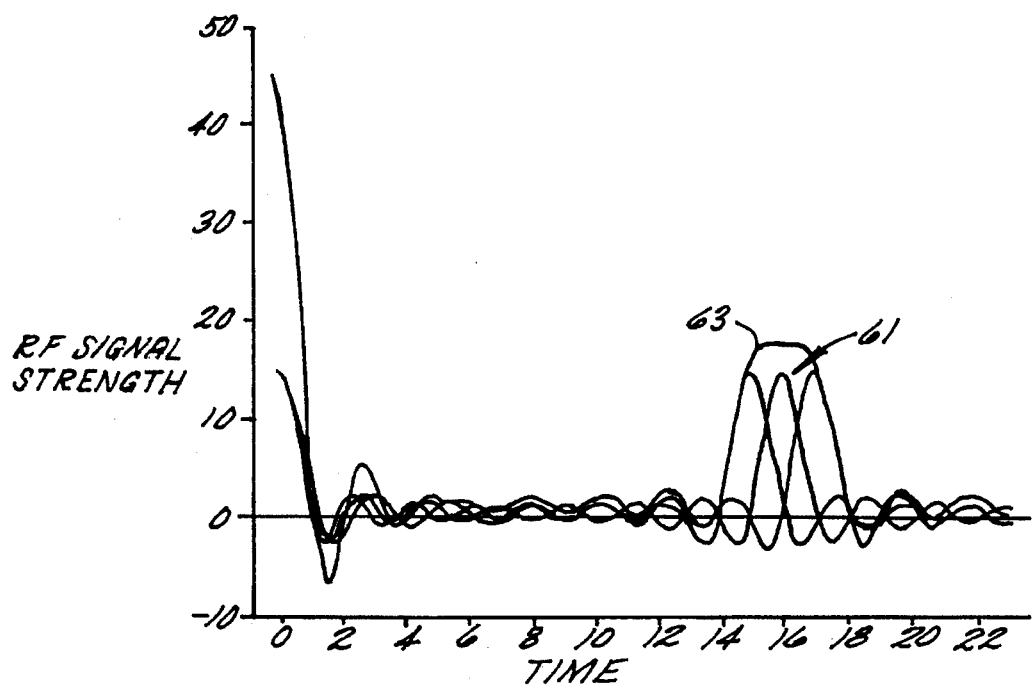
FIG. 8 is a plot of RF signal strength as a function of time in accordance with a third embodiment of the present invention.

Referring to FIG. 8, the static magnetic field gradient strength is made to vary continuously over the sample, whereby echoes from different regions occur at different times, as indicated generally at 61. A sum of the echoes is called a time encoded echo and is extended in time with respect on a single echo, as indicated at 63.

Figure 9:
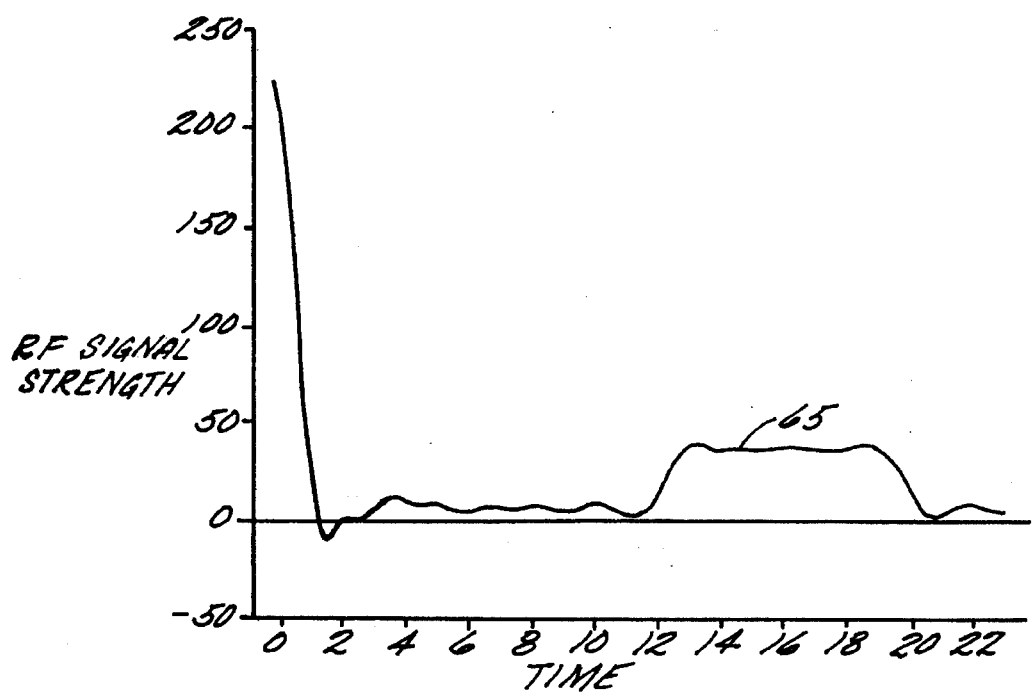
FIG. 9 is a plot of RF signal strength as a function of time in accordance with a fourth embodiment of the present invention.

Referring to FIG. 9, such a continuously varying magnetic field will produce the time encoded echo indicated at 65. In this case the field variation is linear in both the x and y axes and quadratic in directions other than along these axis.

Analysis of the data is accomplished by selecting a short time slice of the time encoded echo 65 (which corresponds to a narrow line in image space) and performing a Fourier transform on the data. A Fourier transform of this time function reveals the frequency spectrum of that particular time slice of the echo which because of the uniform one dimensional magnetic field gradient acting over the sample, is the sample's distribution in image space. In this manner the image is built up line by line. Various techniques such as the Short Time Fourier Transform (STFT), Wavelet Transform (WT) or other known methods can be used to analyze the data.

Further, the atomic particles (i.e., protons) within the voxels will come into phase at a particular time depending upon location within the sample as the sample has been time encoded (it will be understood that the signals received from the sample will be smeared out in time since there are no discreet locations only continuous areas). Signals emanating from the sample are detected and based upon time selection, each voxel in a particular time interval are assigned to a line or row in image space. This time signal is then Fourier transformed, for example as described in *The Fourier Transform and Its Applications* by Ronald N. Bracewell, McGraw-Hill Inc. Second Edition, Revised, 1986, the entirety of which is incorporated herein by reference. The above-discussed time delay or time advance (time encoding) may be used to separate signals into representative row coordinates and the Fourier or other transforms of these time signals assigns a value or an intensity for a particular column location in a given row.

In accordance with an important feature of the present invention, the two dimensional field gradient generated by coil 39 creates a means for relating each voxel of a sample with a pixel on a screen through one iteration of the above-described method. By applying the two dimensional field gradient before the RF echo pulse the sample will be time encoded whereby phase and time is described for example by the following formula:

$$\text{Phase } (x,y,t) = k(x,y) + y(t - te)$$

where:

k is a constant that is directly proportional to the area of quadratic gradient pulse;

t is time;

x and y are coordinates; and te is the time at which an echo occurs.

Therefore, for each point in time there is a row of spins at:

$$y = -(t - te)/k$$

where the phase is zero. In this way, the spatial information along one dimension (y) is encoded in time while the information in the second dimension (x) is frequency encoded.

An important feature of the present invention is that for optimum signal strength and image resolution the spatial variation of the two dimensional magnetic field gradient in one dimension should substantially replicate the spatial variation of the one dimensional magnetic field gradient. For example, if the one dimensional magnetic field gradient varies linearly in one dimension and is constant in the other, the two dimensional magnetic field should vary linearly in one dimension. The second dimensional variation can be arbitrary but will affect the final image shape. A linear variation in the second dimension will allow equally spaced time intervals to represent equal strips in image space.

It will be appreciated that the time duration of the time slices can be changed at will. A short time slice will give excellent resolution in one axis (the time encoded axis) but reduced resolution in the second axis (the frequency encoded axis) due to the small amount of data that can be fourier transformed. Obviously a compromise can be reached in the selection of the time slice which will give optimum resolution in both axes. Furthermore, combinations of different duration time slices may be used with cross correlation techniques to obtain additional refinements in image quality.

The time and frequency encoded axes may be exchanged by changing the two dimensional and one dimensional magnetic field axes through the utilization of different set of coils or other means and produce two images of the same sample. By combining these two images which have their time and frequency axes exchanged it is possible to further enhance resolution of the sample.

Figures 10A, 10B:
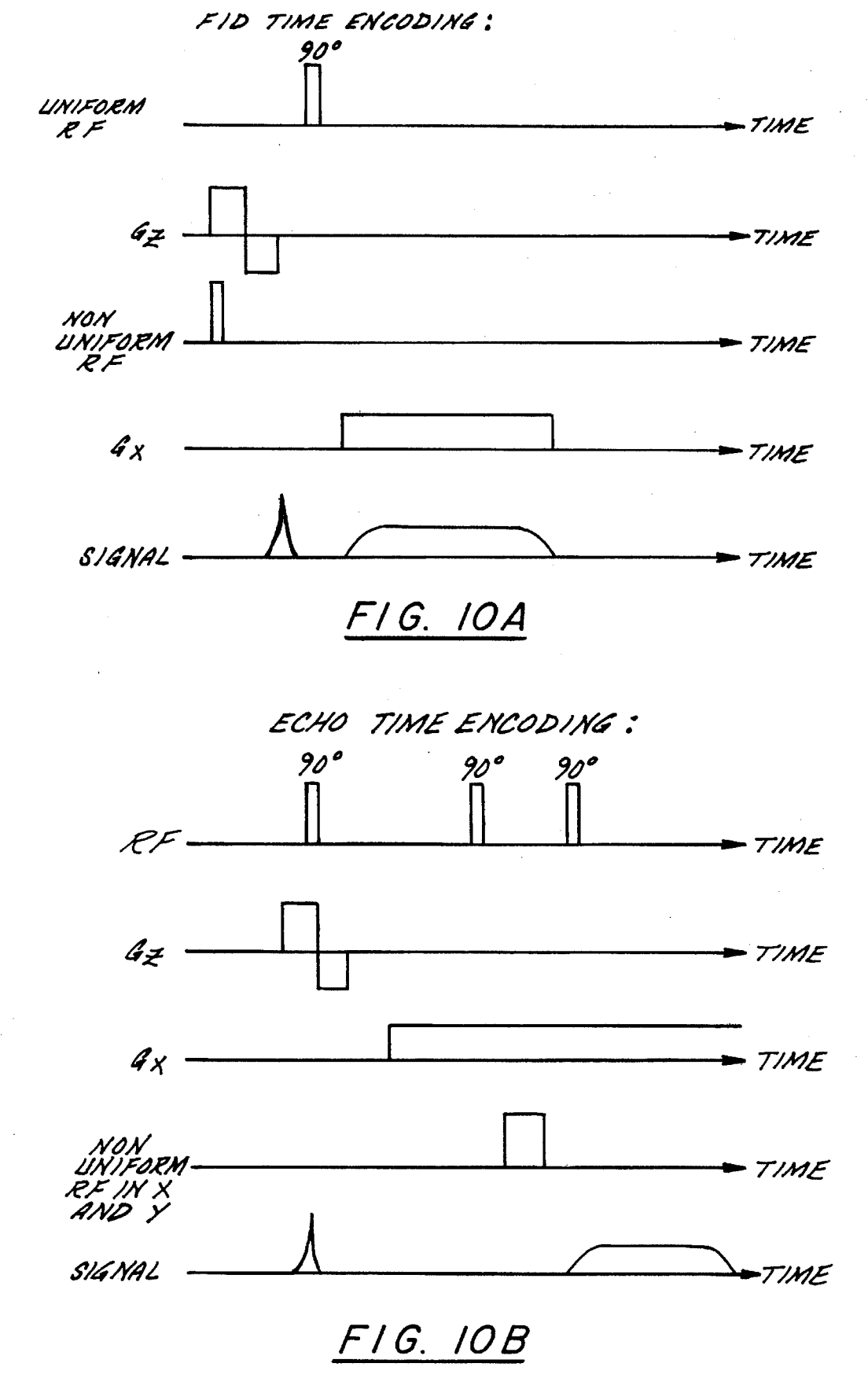
Figure 11A:
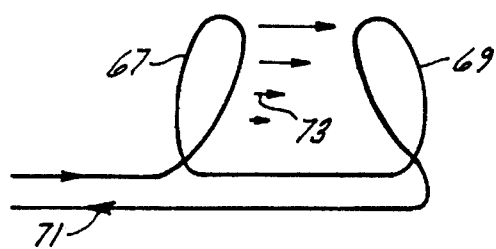
FIG. 11A is a schematic view of one embodiment of RF coils in accordance with the present invention.
Figure 11B:
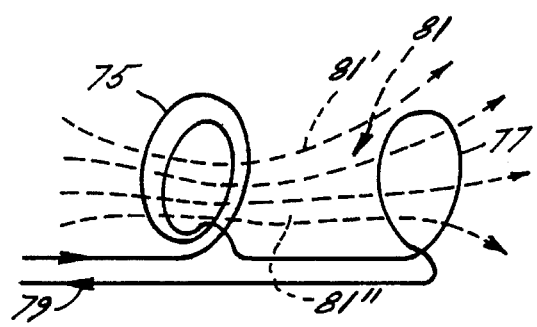
FIG. 11B is a schematic view of another embodiment of RF coils in accordance with the present invention.

An alternate method of the present invention may be employed when the power of RF pulse is not critical as in the case of biological samples. This method would employ a time encoding RF pulse that would have a two dimensional spatial variation. The RF pulse could act immediately upon the Free Induction Decay (FID) portion of the Nuclear Magnetic Resonance (NMR) signal so that images could be produced without waiting for the dephasing time of a spin echo, in principle making this technique faster than the above described two dimensional magnetic gradient encoding scheme. The time encoding would be produced by RF coils that would produce a spatially nonuniform RF field such as that shown in FIG. 6. Referring to FIGS. 10A–B, FID time encoding (FIG. 10A) and echo time encoding (FIG. 10B) in accordance with this alternate method are generally shown. The two dimensional spatial variation RF pulses could be produced by two coils 67, 69 (FIG. 11A) which are bent or angled toward each other and which have opposing current directions, the direction of which is indicated by arrows 71. The RF field being indicated by arrows 73, with the longer arrows indicating a stronger RF field than the shorter arrows. The two dimensional spatial variation RF pulses could also be produced by two coils 75, 77 (FIG. 11B) which have opposing current directions, the direction of which is indicated by arrows 79. Coil 75 has twice as many turns as coil 77, in this example coil 75 has two turns and coil 77 has one turn. The RF field being indicated by arrows 81, with the arrows 81' indicating a stronger RF field than arrows 81".

Figure 12:
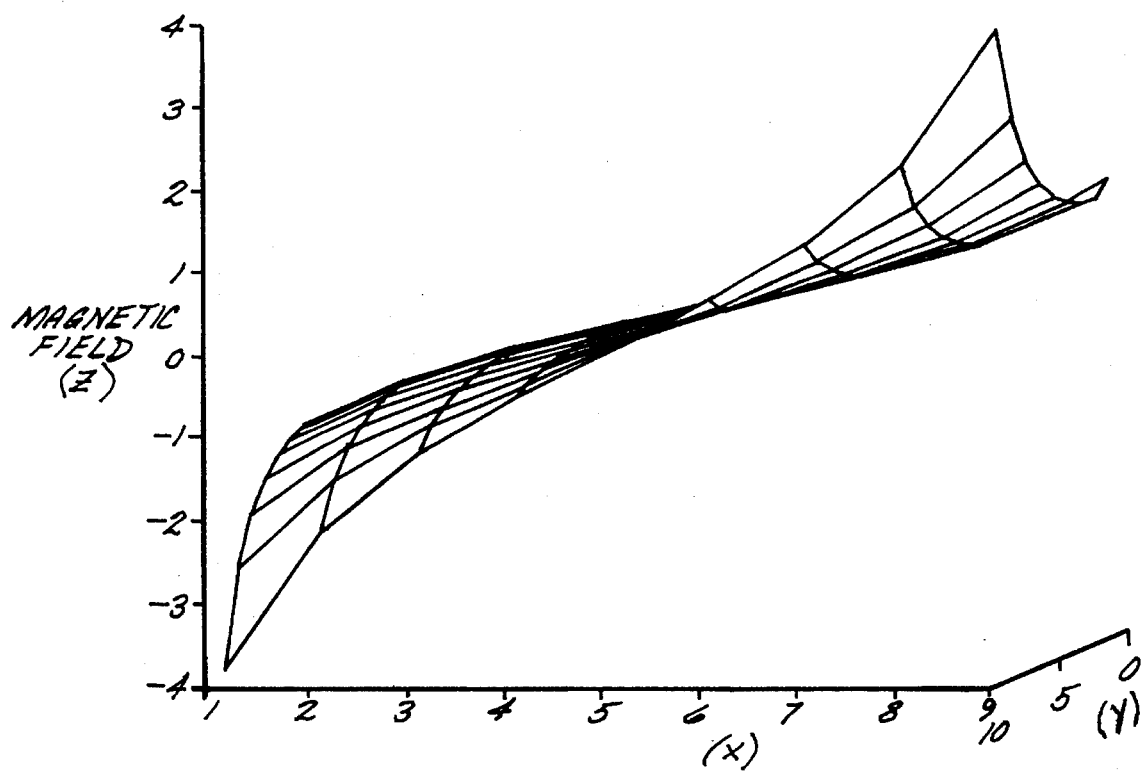
FIG. 12 is a diagrammatic isometric view of the two dimensional, non-uniform magnetic field gradient generated by the gradient coils in accordance with another embodiment of the present invention.

It will be appreciated that both in the two dimensional magnetic gradient time encoding approach and in two dimensional RF pulse time encoding that the intensity of either the magnetic field gradient or the RF field when plotted in three dimensions produces a surface that displays a spatial twist as shown in FIG. 12. This twisting, two dimensional behavior is the reason for the formation of echoes that are displaced in time.

The above described invention is further illustrated by the following example.

EXAMPLE

Figure 13:
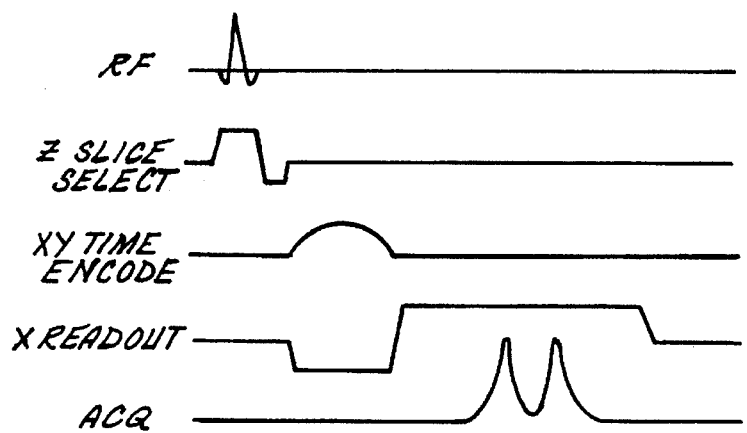
FIG. 13 is a chart of the pulse sequence in accordance with an example of the present invention.
Figure 14:
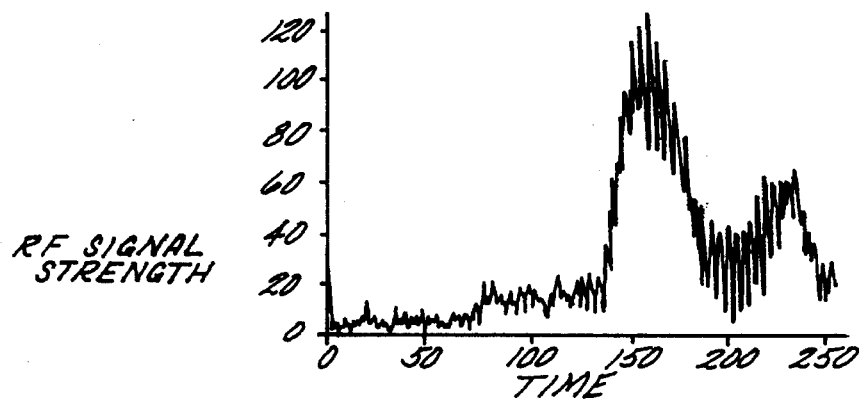
FIG. 14 is a plot of RF signal strength as a function of time in accordance with the example of the present invention.
Figure 15:
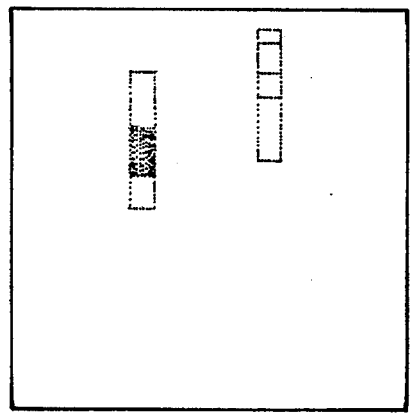
FIG. 15 is a view of an image generated in accordance with the example.

Two 1.0 ml samples of water separated by four centimeters and diagonally opposed to one another in the x-y plane were imaged using the above described method of time encoding. The hardware included the above described electromagnet with coils 35 and 39, the RF coils and a 1.5-T MRI scanner, manufactured by G.E. and sold under the trademark "SIGNA". Referring to FIG. 13, the sequence for applying the magnetic fields and RF pulses is shown. As indicated, a static magnetic field was applied to the sample in the z direction and a RF pulse and gradient magnetic field were used for slice selection. Next, the linear gradient coils 35 and the eight other coils (octapole field set) 39 were simultaneously engaged to provide an nonuniform two dimensional field gradient in the x-y plane for approximately 4 ms. Thereafter, the linear gradient coils 35 were energized with reversed current for 4 ms. As shown in FIG. 14 signal echoes were obtained which were separated in time. The raw data (echoes) were broken into sixteen blocks containing sixteen points each. A Short Time Fourier Transformation was applied to each block yielding an image with sixteen by sixteen resolution as shown in FIG. 15.

While the preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method for magnetic resonance imaging of a sample, comprising the steps of:

generating a static magnetic field orientated in a first direction, the sample being disposed within said static magnetic field, whereby a magnetization vector of a plurality of atomic particles of the sample align with said static magnetic field in said first direction;

generating a first generally linear magnetic field gradient oriented in a second direction, the sample being exposed to said first linear magnetic field gradient to define a two dimensional slice of the sample in a first plane generally perpendicular to said second direction;

generating a first radio frequency pulse at a resonance frequency of the atomic particles, said first radio frequency pulse oriented in a third direction, said third direction being generally perpendicular to said first direction, the sample being exposed to said first radio frequency pulse, said first radio frequency pulse having a first time duration wherein said magnetization vector is rotated into a second plane generally perpendicular to said first direction;

generating a two dimensional, non-uniform, magnetic field gradient oriented in said second plane, the sample being exposed to said two dimensional, non-uniform, magnetic field gradient at a time other than when said sample is exposed to said first radio frequency pulse;

generating a spin echo in the sample, whereby radio frequency signals are emitted from the atomic particles at different times which correspond to two dimensional spacial positions in said slice;

generating a second generally linear magnetic field gradient oriented in a fourth direction, said fourth direction being generally perpendicular to said second direction, the sample being exposed to said second linear magnetic field gradient;

detecting said radio frequency signals emitted from the atomic particles to provide a detected signal indicative of a time domain function of said radio frequency signals detected for said two dimensional slice; and processing said detected signal to transform said detected signal indicative of the time domain function of said radio frequency signals detected to processed signals indicative of a set of frequency domain functions of said radio frequency signals detected.

2. The method of claim 1 wherein said step of generating a spin echo comprises:

generating a second radio frequency pulse at the resonance frequency, said second radio frequency pulse oriented in said third direction, said second radio frequency pulse having a second time duration sufficient for rotating said magnetization vector about 180°, the sample being exposed to said second radio frequency pulse.

3. The method of claim 2 wherein said second time duration is about twice as long as said first time duration.

4. The method of claim 1 wherein said step of generating a spin echo comprises:

generating a reverse generally linear magnetic field gradient orientated in a direction opposite to said second direction, the sample being exposed to said reverse linear magnetic field, in response to said exposure to said reverse linear magnetic field, said magnetization vector is rotated about 180°.

5. The method of claim 1 wherein said step of processing comprises Fourier transform processing.

6. The method of claim 5 wherein said Fourier transform processing comprises short time Fourier transform processing.

7. The method of claim 1 further comprising the step of:

sequentially combining said processed signals to generate an image indicative of said two dimensional slice of said sample.

8. The method of claim 1 wherein said step of generating said static magnetic field further comprises:

continuously varying the strength of said static magnetic field over the sample.

9. The method of claim 1 wherein said two dimensional slice is a transverse slice, a sagittal slice or a coronal slice.

10. The method of claim 1 wherein said step of generating said two dimensional, non-uniform, magnetic field gradient comprises generating said two dimensional, non-uniform, magnetic field gradient to replicate in one dimension a spatial variation of said second linear magnetic field gradient.

11. The method of claim 1 wherein said time other than when said sample is exposed to said first radio frequency pulse of said step of generating said two dimension, non-uniform, magnetic field gradient is a time prior to said sample being exposed to said first radio frequency pulse.

12. The method of claim 1 wherein said time other than when said sample is exposed to said first radio frequency pulse of said step of generating said two dimension, non-uniform, magnetic field gradient is a time after said sample was exposed to said first radio frequency pulse.

13. A device for magnetic resonance imaging of a sample, comprising:

means for generating a static magnetic field orientated in a first direction, the sample being disposed within said static magnetic field, whereby a magnetization vector of a plurality of atomic particles of the sample align with said static magnetic field in said first direction;

means for generating a first generally linear magnetic field gradient oriented in a second direction, the sample being exposed to said first linear magnetic field gradient to define a two dimensional slice of the sample in a first plane generally perpendicular to said second direction;

means for generating a first radio frequency pulse at a resonance frequency of the atomic particles, said first radio frequency pulse oriented in a third direction, said third direction being generally perpendicular to said first direction, the sample being exposed to said first radio frequency pulse, said first radio frequency pulse having a first time duration wherein said magnetization vector is rotated into a second plane generally perpendicular to said first direction;

means for generating a two dimensional, non-uniform, magnetic field gradient oriented in said second plane, the sample being exposed to said two dimensional, non-uniform, magnetic field gradient at a time other than when said sample is exposed to said first radio frequency pulse;

means for generating a spin echo in the sample, whereby radio frequency signals are emitted from the atomic particles at different times which correspond to two dimensional spatial positions in said slice;

means for generating a second generally linear magnetic field gradient oriented in a fourth direction, said fourth direction being generally perpendicular to said second direction, the sample being exposed to said second linear magnetic field gradient;

means for detecting said radio frequency signals emitted from the atomic particles to provide a detected signal indicative of a time domain function of said radio frequency signals detected for said two dimensional slice; and means for processing said detected signal to transform said detected signal indicative of the time domain function of said radio frequency signals detected to processed signals indicative of a set of frequency domain functions of said radio frequency signals detected.

14. The device of claim 13 wherein said means for generating a spin echo comprises:

means for generating a second radio frequency pulse at the resonance frequency, said second radio frequency pulse oriented in said third direction, said second radio frequency pulse having a second time duration sufficient for rotating said magnetization vector about 180°, the sample being exposed to said second radio frequency pulse.

15. The device of claim 14 wherein said second time duration is about twice as long as said first time duration.

16. The device of claim 14 wherein said means for generating said first and second radio frequency pulses comprise a transmitting radio frequency coil.

17. The device of claim 13 wherein said means for generating a spin echo comprises:

means for generating a reverse generally linear magnetic field gradient orientated in a direction opposite to said second direction, the sample being exposed to said reverse linear magnetic field, in response to said exposure to said reverse linear magnetic field, said magnetization vector is rotated about 180°.

18. The device of claim 17 wherein said means for generating said first linear magnetic field gradient and said means for generating said reverse linear magnetic field gradient comprise a plurality of linear gradient coils.

19. The device of claim 13 wherein said means for generating said static magnetic field comprises an electromagnet.

20. The device of claim 13 wherein said means for generating said first linear magnetic field gradient comprises a plurality of linear gradient coils.

21. The device of claim 20 wherein said plurality of linear gradient coils comprise Golay type coils or finger print type coils.

22. The device of claim 13 wherein said means for generating said first radio frequency pulse comprises a transmitting radio frequency coil.

23. The device of claim 22 wherein said transmitting radio frequency coil comprises a Helmholtz type coil or a birdcage type coil.

24. The device of claim 13 wherein said means for generating said two dimensional, non-uniform, magnetic field gradient comprises a plurality of gradient coils.

25. The device of claim 24 wherein each of said plurality of gradient coils comprises an octapole gradient coil arrangement.

26. The device of claim 13 wherein said means for generating a second linear magnetic field gradient comprises a plurality of linear gradient coils.

27. The device of claim 13 wherein said means for detecting said radio frequency signals comprises a receiving radio frequency coil.

28. The device of claim 27 wherein said receiving radio frequency coil comprises a Helmholtz type coil or a birdcage type coil.

29. The device of claim 13 wherein said means for generating said radio frequency pulse and said means for detecting said radio frequency signals comprise a transmitting radio frequency coil.

30. The device of claim 13 wherein said means for processing comprises means for Fourier transform processing.

31. The device of claim 13 further comprising:

means for sequentially combining said processed signals to generate an image indicative of said two dimensional slice of said sample.

32. The device of claim 13 wherein said means for generating said static magnetic field further comprises:

means for continuously varying the strength of said static magnetic field over the sample.

33. The device of claim 13 wherein said two dimensional slice is a transverse slice, a sagittal slice or a coronal slice.

34. The device of claim 13 wherein said means for generating said two dimensional, non-uniform, magnetic field gradient comprises:

means for generating said two dimensional, non-uniform, magnetic field gradient to replicate in one dimension a spatial variation of said second linear magnetic field gradient.

35. The device of claim 13 wherein said time other than when said sample is exposed to said first radio frequency pulse of said means for generating said two dimension, non-uniform, magnetic field gradient is a time prior to said sample being exposed to said first radio frequency pulse.

36. The device of claim 13 wherein said time other than when said sample is exposed to said first radio frequency pulse of said means for generating said two dimension, non-uniform, magnetic field gradient is a time after said sample was exposed to said first radio frequency pulse.

* * * * *